(12) United States Patent
Cho et al.

(10) Patent No.: US 7,077,904 B2
(45) Date of Patent: Jul. 18, 2006

(54) METHOD FOR ATOMIC LAYER DEPOSITION (ALD) OF SILICON OXIDE FILM

(75) Inventors: Byoung Ha Cho, Daejeon-si (KR); Yong Il Kim, Chuncheongnam-do (KR); Cheol Ho Shin, Chuncheongnam-do (KR); Won Hyung Lee, Chungcheongnam-do (KR); Jung Soo Kim, Chungcheongnam-do (KR); Sang Tae Sim, Chuncheongbuk-do (KR)

(73) Assignee: Samsung Electronics Co., Ltd. (KR)

( * ) Notice: Subject to any disclaimer, the term of this patent is extended or adjusted under 35 U.S.C. 154(b) by 166 days.

(21) Appl. No.: 10/422,252

(22) Filed: Apr. 23, 2003

(65) Prior Publication Data

US 2003/0203113 A1    Oct. 30, 2003

(30) Foreign Application Priority Data

Apr. 25, 2002   (KR) .................. 10-2002-0022618

(51) Int. Cl.
*C30B 22/18* (2006.01)

(52) U.S. Cl. .................. 117/104; 117/105; 117/106; 117/107; 117/108; 117/949

(58) Field of Classification Search .................. 117/104, 117/105, 106, 107, 108, 949
See application file for complete search history.

(56) References Cited

U.S. PATENT DOCUMENTS

| | | | |
|---|---|---|---|
| 3,313,792 A | 4/1967 | Duck et al. | |
| 5,037,514 A * | 8/1991 | Yamazaki | 438/788 |
| 5,470,800 A | 11/1995 | Muroyama | |
| 6,037,275 A | 3/2000 | Wu et al. | |
| 6,090,442 A | 7/2000 | Klaus et al. | |
| 6,270,572 B1 | 8/2001 | Kim et al. | |
| 6,391,803 B1 | 5/2002 | Kim et al. | |
| 6,465,371 B1 | 10/2002 | Lim | 438/785 |
| 6,534,395 B1 * | 3/2003 | Werkhoven et al. | 438/627 |
| 6,664,156 B1 * | 12/2003 | Ang et al. | 438/229 |
| 2002/0001974 A1 | 1/2002 | Chan | |
| 2002/0047151 A1 * | 4/2002 | Kim et al. | 257/301 |
| 2002/0068466 A1 | 6/2002 | Lee et al. | 438/765 |
| 2002/0164890 A1 | 11/2002 | Kwan et al. | 438/763 |

(Continued)

FOREIGN PATENT DOCUMENTS

EP         1 003 210         5/2000

(Continued)

OTHER PUBLICATIONS

Klaus, J.W., et al., "Atomic layer controlled growth of $SiO_2$ films using binary reaction sequence chemistry," American Institute of Physics, 1997, pp. 1092-1094.

*Primary Examiner*—Robert Kunemund
(74) *Attorney, Agent, or Firm*—Mills & Onello LLP

(57) ABSTRACT

The present invention relates to a method for forming silicon oxide films on substrates using an atomic layer deposition process. Specifically, the silicon oxide films are formed at low temperature and high deposition rate via the atomic layer deposition process using a $Si_2Cl_6$ source unlike a conventional atomic layer deposition process using a $SiCl_4$ source. The atomic layer deposition apparatus used in the above process can be in-situ cleaned effectively at low temperature using a HF gas or a mixture gas of HF gas and gas containing —OH group.

23 Claims, 5 Drawing Sheets

U.S. PATENT DOCUMENTS

| | | | |
|---|---|---|---|
| 2003/0015764 A1* | 1/2003 | Raaijmakers et al. | 257/424 |
| 2003/0188682 A1 | 10/2003 | Tois et al. | 117/105 |
| 2004/0096582 A1 | 5/2004 | Wang et al. | |

FOREIGN PATENT DOCUMENTS

| | | |
|---|---|---|
| EP | 1 096 042 | 5/2001 |
| EP | 1 139 399 | 10/2001 |
| JP | 06132276 | 5/1994 |
| JP | 10189582 | 7/1998 |
| JP | 2001002990 | 1/2001 |
| KR | 02-2579 | 1/2002 |
| KR | 02-44422 | 6/2002 |
| KR | 2002-85487 | 11/2002 |

* cited by examiner

US 7,077,904 B2

METHOD FOR ATOMIC LAYER DEPOSITION (ALD) OF SILICON OXIDE FILM

BACKGROUND OF THE INVENTION

1. Field of the Invention

The present invention generally relates to methods for forming silicon oxide films on substrates via atomic layer deposition (hereinafter, referred to as 'ALD') processes, and more specifically, to a method for forming a silicon oxide film at low temperature and high deposition rate using $Si_2Cl_6$ (hexachloro disilane; hereinafter, referred to as 'HCD') and $H_2O$ sources, and catalysts.

2. Description of the Prior Art

Generally, a silicon oxide film is one of the most commonly used thin films in a semiconductor since it provides superior interface with silicon and has excellent dielectric characteristics. There are two conventional methods for depositing a silicon oxide film: (1) oxidation process wherein silicon is oxidized at a temperature of more than 1000° C.; and (2) a Chemical Vapor Deposition (CVD) process wherein more than two sources are provided at a temperature ranging from 600 to 800° C. These methods cause diffusion on interface due to high deposition temperature, thereby degrading electrical characteristics of devices.

As semiconductor devices having memory capacity of more than giga bytes are currently required to be manufactured, thin films used in semiconductor devices should be controlled at the atomic layer level. Further, the thin films are required to have excellent step coverage and low deposition temperature to prevent diffusion and oxidation at the interfaces. To satisfy the requirements, an atomic layer deposition process has been proposed.

Conventionally, the silicon oxide film is deposited at a temperature of more than 600K via the atomic layer deposition process using $SiCl_4$ and $H_2O$ sources. The conventional deposition process is as follows.

First, a $SiCl_4$ source is provided in a reaction chamber containing a substrate having hydroxyl group (—OH)s on its surface. The $SiCl_4$ source reacts with the hydroxyl group, and —$SiCl_3$ is adsorbed on the surface of the substrate, HCl by-products are formed (see Reaction Formula 1). When the reaction of $SiCl_4$ with the hydroxyl group is saturated, the remaining $SiCl_4$ no longer reacts (self-limiting condition), and the surface of the substrate has —$SiCl_3$ surface chemical species adsorbed thereon.

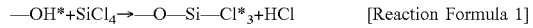
      —OH\*+SiCl_4→—O—Si—Cl\*_3+HCl    [Reaction Formula 1]

When the above reaction is complete, the $H_2O$ source is provided to the reactor chamber. The $H_2O$ source reacts with the —$SiCl_3$ surface chemical species to generate adsorption of the hydroxyl group thereto and HCl by-products (see Reaction Formula 2). When the reaction of $H_2O$ with the —$SiCl_3$ surface chemical species is saturated, the remaining $H_2O$ no longer reacts (self-limiting condition), and the surface of the substrate has hydroxyl groups adsorbed thereon.

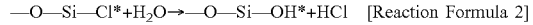
      —O—Si—Cl\*+H_2O→—O—Si—OH\*+HCl    [Reaction Formula 2]

The above-described process is repeated to deposit the silicon oxide film. However, the conventional method requires high temperature of more than 600K, long time necessary for deposition and a large amount of sources.

In order to solve the foregoing problems, a method for forming silicon oxide films at a temperature below 200° C. using catalysts and small amount of sources is disclosed in U.S. Pat. No. 6,090,442. The disclosed method uses catalysts, which allows silicon oxide to be deposited even at a temperature below 200° C. However, the disclosed method has the following problems.

First, when a silicon oxide film is deposited at a temperature ranging from room temperature to 50° C., the by-products from the reaction and unreacted liquid sources such as HCD and $H_2O$ are not easily removed due to low temperature in the reactor chamber. These materials exist as particles in the thin film after deposition, which deteriorate properties of the thin film.

Second, when a silicon oxide film is deposited at a temperature above 50° C., by-products resulting from reaction and unreacted liquid sources such as HCD and $H_2O$ are easily removed. However, the deposition rate of thin film is very low. That is, when a silicon oxide film is deposited using $SiCl_4$, $H_2O$ and catalysts at a temperature above 50° C., the deposition rate is lower than 1.0 Å per cycle (see FIG. 1). As a result, the yield of device is reduced.

When a silicon oxide film is deposited via the above conventional atomic layer deposition process, residuals are generated in a reactor chamber during the formation process by a plurality of reaction gases. These residuals are adsorbed to a heater, a disc, and an outside wall and an upper surface of reactor chamber as well as the substrate. The residuals in the atomic layer deposition reactor are removed by in-situ cleaning which uses thermal or plasma method using $NF_3$ gas. The cleaning method is used in deposition process of silicon oxide film performed at temperature above 400° C.

As a result, when a silicon oxide film is deposited via the atomic layer deposition process at low temperature below 400° C., in-situ cleaning cannot be performed.

SUMMARY OF THE INVENTION

It is an object of the present invention to provide a method for forming a silicon oxide film at low temperature and a high deposition rate via an atomic layer deposition process.

In order to achieve the above-described object, the method for forming a silicon oxide film via an atomic layer deposition process employs a HCD source to improve the deposition rate instead of the conventional $SiCl_4$ source.

DETAILED DESCRIPTION OF THE PREFERRED EMBODIMENTS

The method in accordance with the present invention for forming a silicon oxide film via the atomic layer deposition process using the HCD source comprises:

(a) exposing a substrate having —OH groups adsorbed on the surface thereof to a first catalyst to activate hydrogen;

(b) exposing the surface of the substrate to a first source of $Si_2Cl_6$ to perform a reaction 3, where the reaction 3 is —OH*+$Si_2Cl_6$→—O—$Si_2Cl_5$/—O—$Si_2Cl_4$+HCl;

(c) exposing the surface of the substrate to a second catalyst to activate chlorine; and (d) exposing the surface of the substrate to a second source of $H_2O$ to perform a reaction 4, where the reaction 4 is —O—Si—Cl*+$H_2O$→—O—Si—OH+HCl.

Figure 2:
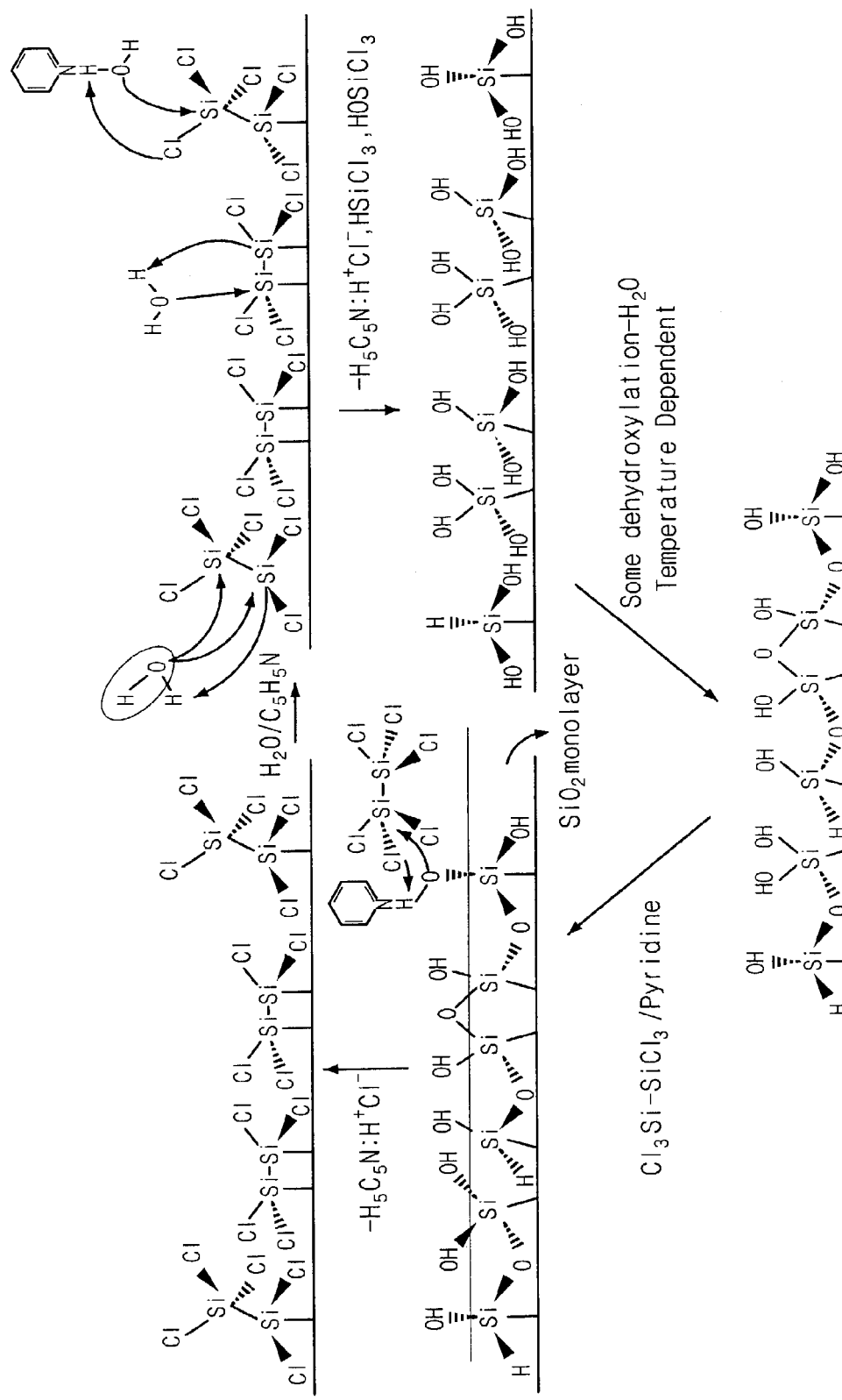
FIG. 2 is a reaction scheme illustrating the mechanism of depositing a silicon oxide film using a $Si_2Cl_6$ source.

The above process will be described in detail with reference to FIG. 2.

HCD gas and a catalyst are provided on the surface of a substrate having hydroxyl groups adsorbed thereon. The catalyst activates the hydroxyl group adsorbed on the surface. The activated hydroxyl group reacts with the HCD source, and —$Si_2Cl_4$ or —$Si_2Cl_5$ is adsorbed to the surface of the substrate and by-products are generated. The activated surface-adsorbed groups react with the provided $H_2O$ source, resulting in generation of HCl as by-products and adsorption of the hydroxyl group to —$Si_2Cl_4$ or —$Si_2Cl_5$. When the reaction of $H_2O$ with the activated surface-adsorbed group is saturated, remaining $H_2O$ no longer reacts (self-limiting condition).

The HCD and $H_2O$ sources used in the present invention are required to be alternately provided to the reactor chamber. They should not be in the reactor chamber simultaneously. Therefore, when no more reactions occur in each step of providing sources, the pressure of the reactor chamber is decreased to a pressure below 1 Torr by pumping, or purge process is performed using inert gas, or pumping and purging are performed simultaneously to remove residual sources and by-products from the chamber.

Foregoing processes constitute a cycle to form multiple layers of thin films, and the cycle may be repeated. That is, a silicon oxide film can be formed by repeating the steps (a) through (d) to have a desired thickness.

Figure 3:
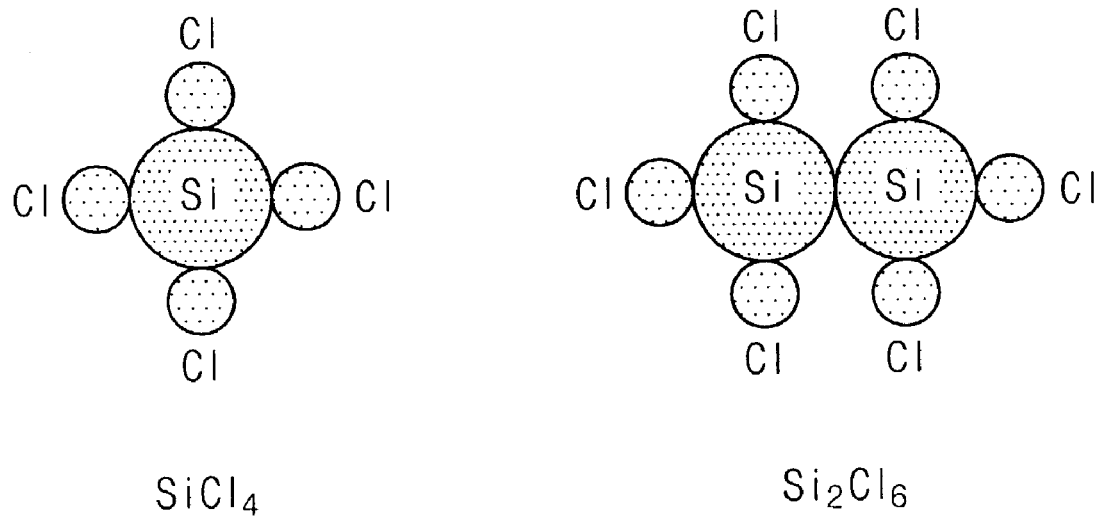
FIG. 3 illustrates the structures of $SiCl_4$ and $Si_2Cl_6$.

The method of the present invention provides a high deposition ratio due to difference in structures of $SiCl_4$ and HCD (see FIG. 3). —$SiCl_3$ is adsorbed to the surface of the substrate when the silicon oxide film is deposited using $SiCl_4$ while —$Si_2Cl_4$ or —$Si_2Cl_5$ is adsorbed to the surface of the substrate when the silicon oxide film is deposited using HCD. That is, one Si atom is adsorbed to the surface when $SiCl_4$ is used while two Si atoms are adsorbed to the surface when HCD is used. As a result, when the HCD source is used, a deposition ratio is about two times higher than that of when the $SiCl_4$ source is used.

The above-described ALD process is performed at low temperature ranging from 50 to 200° C., preferably from 50 to 140° C., using catalysts which are Lewis bases such as pyridine, trimethylamine (TMA) or triethylamine (TEA) to improve efficiency of deposition at low temperature.

The reason for performing the atomic layer deposition process at a temperature above 50° C. is to prevent deterioration of properties of thin films. When silicon oxide films are deposited at a temperature ranging from room temperature to 50° C., a porous thin film is formed, which deteriorates properties of thin film. In addition, by-products resulting from the reaction and unreacted liquid sources are not easily removed due to the low temperature of the chamber, which exist as particles in the thin film, thereby degrading properties of the thin films.

It is preferable that the ALD process is performed in the chamber under a pressure ranging from 1 mTorr to 10 Torr.

When the formation of thin film is complete, the reactor chamber in-situ cleaning can be effectively performed using a HF gas or a mixture gas of HF gas and gas containing —OH group as cleaning gas at a temperature similar to the deposition temperature of silicon oxide film.

The —OH group in the silicon oxide film deposited at low temperature via the atomic layer deposition process using a catalyst serves as a catalyst when a HF gas is injected. As a result, the HF gas is decomposed into fluorine and hydrogen due to the catalyst function of the —OH group. The silicon oxide film reacts with the decomposed fluorine to form $SiF_4$ as by-products, which easily removed.

When mixture gas of $H_2O$ or $H_2O_2$ gas which contains —OH group and HF gas is used in the in-situ cleaning of the atomic layer deposition apparatus, more HF gas is decomposed into fluorine and hydrogen to improve efficiency of in-situ cleaning.

The in-situ cleaning comprises the following steps (a)–(d):

(a) Wafers positioned on a susceptor for loading at least one wafer are conveyed out of the chamber after the completion of formation process;

(b) a cleaning atmosphere is prepared in the chamber by maintaining the temperature therein at the deposition temperature;

(c) residuals, impurities and films deposited on undesired portions of the chamber are cleaned under the cleaning atmosphere by providing a HF gas or a mixture gas of HF gas and gas containing —OH group as cleaning gas; and (d) by-products and impurities generated during the cleaning process are removed out of the chamber by injecting inert gas.

The in-situ cleaning is performed at the same temperature as the ALD process or within ±10% margin of the temperature. In this manner, in-situ cleaning is possible for low temperature ALD apparatus.

Hereinafter, the preferred embodiments will be described in detail. However, it should be noted that the scope of the present invention is not limited to the preferred embodiments.

EXAMPLE 1

Figure 4:
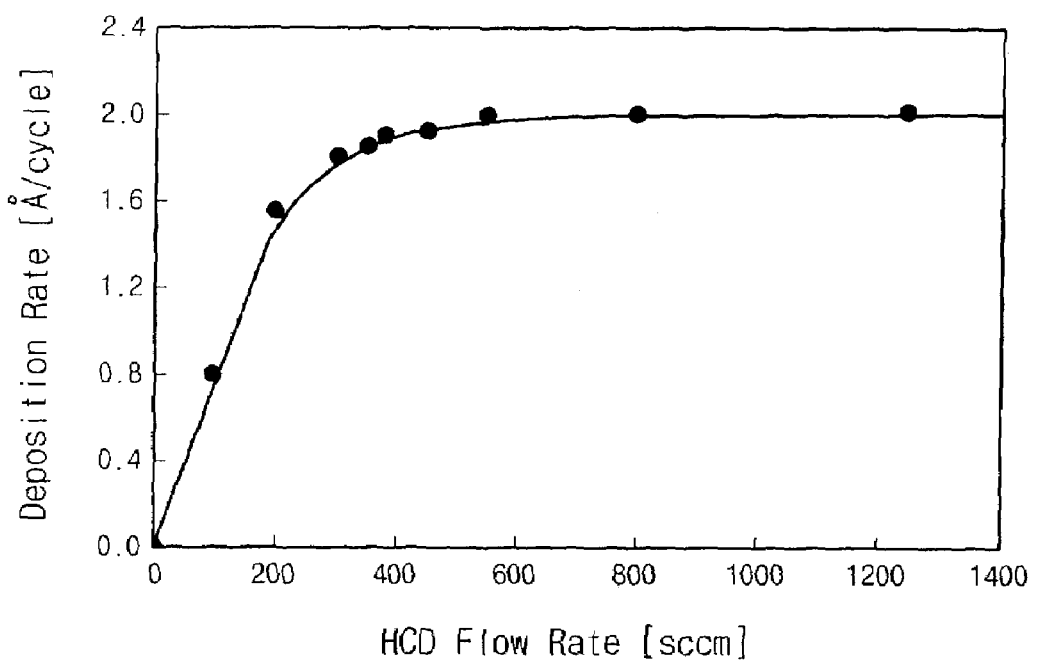
FIG. 4 is a graph illustrating the deposition rate of silicon oxide film depending on the amount of $Si_2Cl_6$ source during the ALD process of the present invention.

Variation in Deposition Rate of Silicon Oxide Film Depending on Increase in Amount of HCD Source The following experiment was conducted to find out the deposition rate of silicon oxide film depending on the increase in the amount of HCD source. HCD where the flow rate varies as shown in FIG. 4 and pyridine having a flow rate of 100 sccm were provided to a chamber. Residual sources in the chamber were then removed by pumping until the pressure reaches 1 mTorr. Thereafter, $H_2O$ having a flow rate of 500 sccm and pyridine having a flow rate of 100 sccm were provided to the chamber, and the residual sources were again removed by pumping until the pressure reaches 1 mTorr. Above processes were repeated to form a silicon oxide film.

As shown in FIG. 4, the deposition rate increased as the amount of HCD source increased. The deposition rate was saturated at 2 Å/cycle. The saturation occurs due to self-limiting condition of HCD and chemical species adsorbed to the surface of the substrate.

EXAMPLE 2

Figure 1:
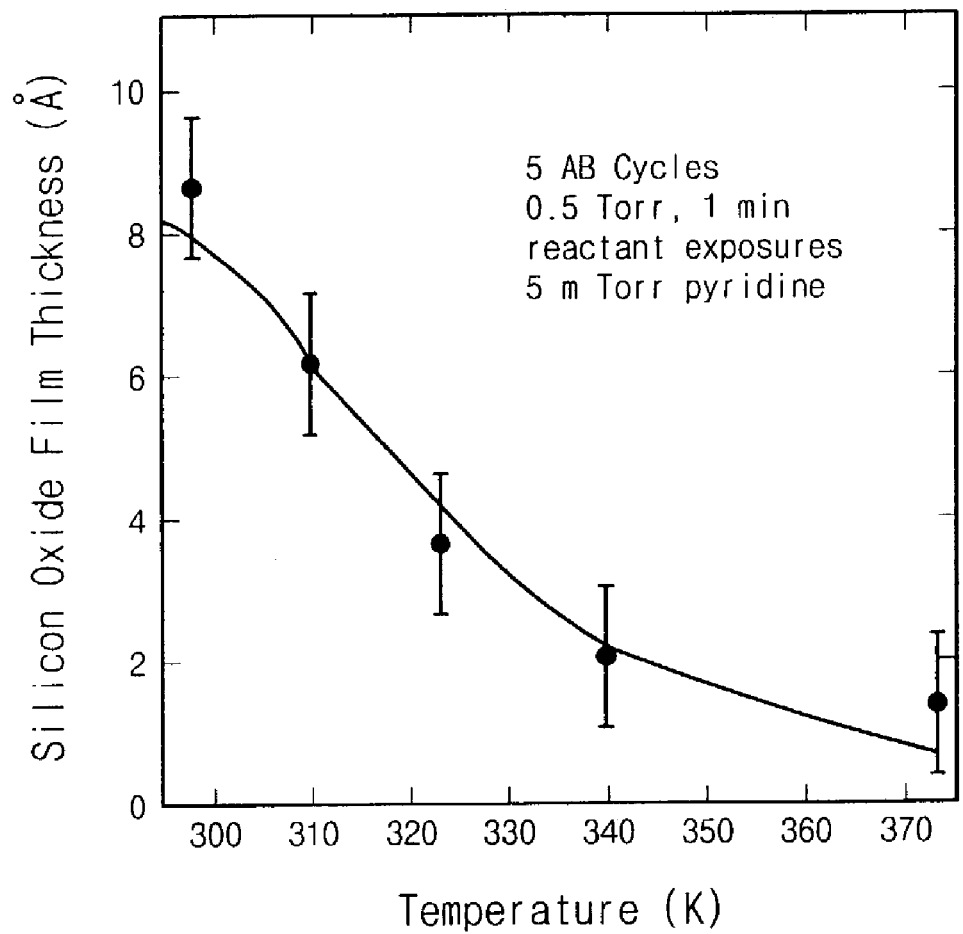
FIG. 1 is a graph illustrating the deposition rate of silicon oxide film depending on the reaction temperature during the conventional ALD process using a $SiCl_4$ source.

Variation of Deposition Rate of Silicon Oxide Film Depending on Deposition Temperature The following experiment was conducted to find out the deposition rate of silicon oxide film depending on deposition temperature. For the comparison with U.S. Pat. No. 6,090,422 wherein $SiCl_4$ is used, the experiment was conducted at the temperature similar to that of U.S. Pat. No. 6,090,422 shown in FIG. 1. HCD having a flow rate of 500 sccm and pyridine having a flow rate of 100 sccm were provided to a chamber. Residual sources in the chamber were then removed by pumping until the pressure reaches 1 mTorr. Thereafter, $H_2O$ having a flow rate of 500 sccm and pyridine having a flow rate of 100 sccm were provided to the chamber, and the residual sources were again removed by pumping until the pressure reaches 1 mTorr. Above processes were repeated to form a silicon oxide film.

Figure 5:
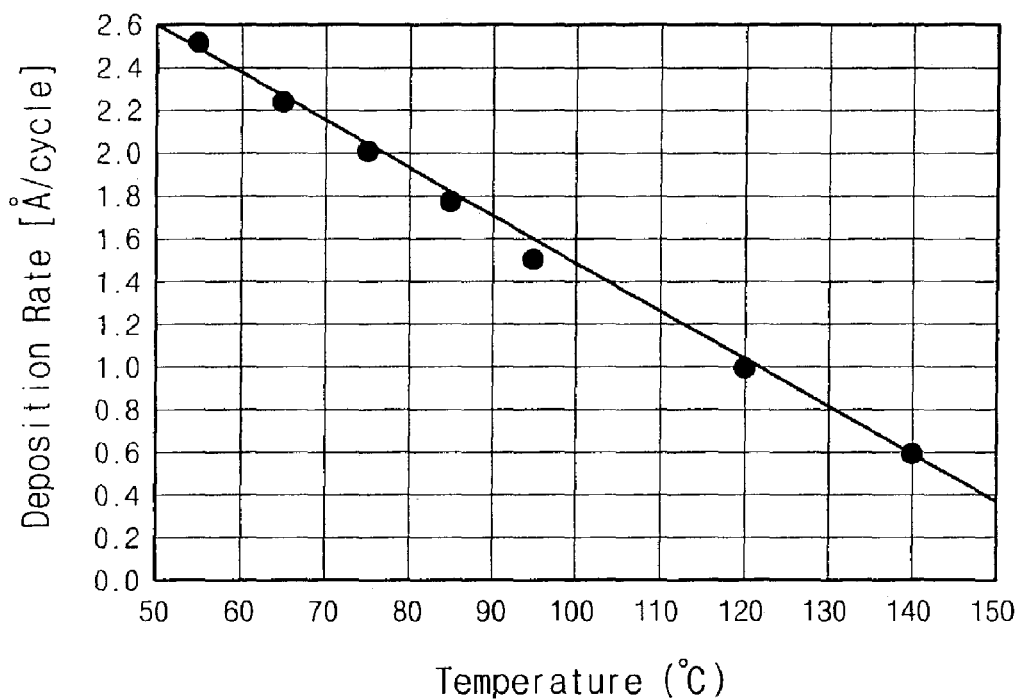
FIG. 5 is a graph illustrating the deposition rate of silicon oxide film depending on the reaction temperature during the ALD process of the present invention.

As shown in FIG. 5, the deposition rate of silicon oxide film decreased as the deposition temperature increased. However, when the deposition rate shown in FIG. 5 was compared with that shown in FIG. 1, the deposition rate (Å/cycle) of the present invention was about 1.5 to 2.0 times higher than that shown in FIG. 1 under the temperatures ranging from 320 to 370K, that is, 50 to 100° C.

As discussed earlier, according to the present invention, the ALD process allows silicon oxide films to be formed at low temperature and at higher deposition rate using the HCD source, thereby increasing production of wafers.

Additionally, in-situ cleaning for the ALD apparatus can be performed at low temperature below 200° C. using a HF gas or a mixture gas of HF gas and gas containing —OH group, thereby improving uniformity and reproducibility of wafer and properties of film formed thereon. As a result, the yield of wafers is improved.

What is claimed is:

1. In a method for forming a silicon oxide film on a surface of a substrate using an atomic layer deposition (ALD) process, the improvement comprising the sequential steps of:
    (a) exposing a substrate having —OH groups adsorbed on a surface thereof to a first catalyst suitable for activating at least a portion of the hydrogen of the —OH groups;
    (b) simultaneously with and/or following step (a), exposing the substrate surface to a first source of hexachloro disilane ($Si_2Cl_6$) to form an oxygen/silicon/chlorine complex along the substrate surface;
    (c) following step (b), exposing the substrate surface to a second catalyst suitable for activating at least a portion of the chlorine in the oxygen/silicon/chlorine complex along the substrate surface; and,
    (d) following step (c), exposing the substrate surface to an oxygen source to react with the activated chlorine to form a silicon oxide layer consisting essentially of silicon dioxide with —OH groups along the substrate surface.

2. In the method according to claim 1, the further improvement wherein the atomic layer deposition process is performed at a temperature ranging from about 50 to 200° C.

3. In the method according to claim 1, the further improvement wherein the atomic layer deposition process is performed at a temperature ranging from about 50 to 140° C.

4. In the method according to claim 1, the further improvement wherein the process steps (a) to (d) are repeatedly performed to form a silicon oxide film having a desired thickness of multiple atomic layers.

5. In the method according to claim 1, the further improvement wherein the catalyst is a Lewis base.

6. In the method according to claim 1, the further improvement wherein the first catalyst is selected from the group consisting of pyridine, trimethylamine (TMA), triethylamine (TEA) and mixtures thereof.

7. A method for forming a silicon oxide film on a substrate in a reaction chamber, said method comprising the steps of:
    (a) exposing a substrate having —OH groups adsorbed on a surface thereof to a first catalyst to activate a hydrogen portion of the —OH groups;
    (b) exposing the surface of the substrate to a first source of $Si_2Cl_6$ to perform a reaction in which oxygen/silicon/chlorine complexes of the form —O—$Si_2Cl_5$ and/or —O—$Si_2Cl_4$ are formed;
    (c) exposing the surface of the substrate to a second catalyst to activate chlorine in the oxygen/silicon/chlorine complexes; and,
    (d) exposing the surface of the substrate to an oxygen source to perform a reaction in which the activated chlorine reacts to leave a surface layer consisting essentially of silicon dioxide with —OH groups adsorbed thereon.

8. The method according to claim 7, wherein the steps (b) and (d) are performed at a temperature ranging from about 50 to 200° C., respectively.

9. The method according to claim 7, wherein the steps (a) through (d) are repeated two or more times.

10. The method according to claim 7, wherein the first catalyst and the second catalyst are the same.

11. The method according to claim 7, further comprising the step of removing residual gases from the reaction chamber by pumping or purging prior to performing step (c).

12. The method according to claim 7, further comprising the step of removing residual gases from the reaction chamber by pumping or purging after performing step (d).

13. The method according to claim 7, further comprising the step of performing in-situ cleaning of the reaction chamber after step (d).

14. The method according to claim 13, wherein the in-situ cleaning is performed at a temperature ranging from about 50 to 200° C.

15. The method according to claim 13, wherein the in-situ cleaning is performed at a process temperature that is within ±10% of the process temperature at which steps (b) and/or (d) were carried out.

16. The method according to claim 13, wherein the in-situ cleaning is performed using a HF gas or a gas mixture consisting essentially of HF gas and gas containing —OH group.

17. The method according to claim 16, wherein the gas containing —OH group is $H_2O$ or $H_2O_2$.

18. In a method for forming a silicon oxide film on a surface of a substrate in a reaction chamber using an atomic layer deposition (ALD) process, the improvement comprising the sequential steps of:
    (a) exposing a substrate having —OH groups adsorbed on a surface thereof to a first catalyst suitable for activating at least a portion of the hydrogen of the —OH groups;
    (b) simultaneously with and/or following step (a), exposing the substrate surface to a first source of hexachloro disilane ($Si_2Cl_6$) to form an oxygen/silicon/chlorine complex along the substrate surface;

(c) following step (b), exposing the substrate surface to a second catalyst suitable for activating at least a portion of the chlorine in the oxygen/silicon/chlorine complex along the substrate surface; and, (d) following step (c), exposing the substrate surface to an oxygen source to react with the activated chlorine to form a silicon oxide layer consisting essentially of silicon dioxide with —OH groups along the substrate surface;

(e) repeating steps (a) to (d) one or more additional times to form a silicon oxide thin film comprising multiple atomic layers, each consisting essentially of silicon dioxide; and, (f) performing in-situ cleaning of the reaction chamber at a temperature of about 50° C. to about 200° C.

19. In the method of claim 18, the further improvement wherein the first catalyst is selected from the group consisting of pyridine, trimethylamine (TMA), triethylamine (TEA), and mixtures thereof.

20. In the method of claim 19, the further improvement wherein the in-situ cleaning step (f) is performed using HF gas or a gas mixture consisting essentially of HF gas and gas containing —OH group in suitable proportions for effecting cleaning of the reaction chamber.

21. In the method of claim 1, the further improvement wherein said oxygen source is $H_2O$.

22. The method according to claim 7, wherein said oxygen source is $H_2O$.

23. In the method of claim 18, the further improvement wherein said oxygen source is $H_2O$.

* * * * *